(12) United States Patent
Chiu (10) Patent No.: US 11,024,560 B2
(45) Date of Patent: Jun. 1, 2021

(54) SEMICONDUCTOR STRUCTURE AND MANUFACTURING METHOD THEREOF

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/583,290

(22) Filed: Sep. 26, 2019

(65) Prior Publication Data

US 2021/0098337 A1    Apr. 1, 2021

(51) Int. Cl.
*H01L 23/48*    (2006.01)
*H01L 23/00*    (2006.01)
*H01L 21/768*    (2006.01)

(52) U.S. Cl.
CPC ...... *H01L 23/481* (2013.01); *H01L 21/76898* (2013.01); *H01L 24/03* (2013.01); *H01L 24/05* (2013.01); *H01L 2224/0557* (2013.01)

(58) Field of Classification Search
CPC ....... H01L 23/481; H01L 24/03; H01L 24/05; H01L 21/76898; H01L 2224/0557; H01L 21/76802
See application file for complete search history.

(56) References Cited

U.S. PATENT DOCUMENTS

| | | | |
|---|---|---|---|
| 10,840,190 B1* | 11/2020 | Yang | ............ H01L 23/5384 |
| 2010/0178761 A1* | 7/2010 | Chen | ............ H01L 23/49816 |
| | | | 438/613 |
| 2015/0102497 A1* | 4/2015 | Park | ............ H01L 24/06 |
| | | | 257/774 |

FOREIGN PATENT DOCUMENTS

TW    201801285 A    1/2018

\* cited by examiner

*Primary Examiner* — Jasmine J Clark
(74) *Attorney, Agent, or Firm* — CKC & Partners Co., LLC (57) ABSTRACT

A semiconductor structure including a substrate, a dielectric layer, a conductive via, and a landing pad is provided. The dielectric layer is positioned on the substrate. The conductive via penetrates from a lower surface of the substrate to an upper surface of the dielectric layer. The landing pad is embedded in the conductive via.

10 Claims, 7 Drawing Sheets

SEMICONDUCTOR STRUCTURE AND MANUFACTURING METHOD THEREOF

BACKGROUND

Field of Invention

The present disclosure relates to a semiconductor structure and a manufacturing method thereof. More particularly, the present disclosure relates to a semiconductor structure including a landing pad embedded in a conductive via and a manufacturing method thereof.

Description of Related Art

Generally, through-silicon vias (TSVs) have been used to form electrical connections within System-in-Package architectures to connect multiple semiconductor dies through the semiconductor die substrates. One method of manufacturing these TSVs is known as a via-first method, in which the TSV is formed through the substrate prior to the formation of the semiconductor die s metallization layers. Another method of manufacturing these TSVs is known as a via-last method, in which the metallization layers are formed over the substrate first, and the TSV is formed to extend through both the substrate and the metallization layers. The landing pads in the metallization layers must be large enough to connect with the TSVs, and therefore the landing pad would occupy large space. Moreover, when forming the TSVs to connect with the landing pads, sometimes, the TSVs cannot accurately align with the landing pads.

In view of the foregoing, it is necessary to develop a new method of manufacturing TSVs.

SUMMARY

The present disclosure provides a semiconductor structure including a substrate, a dielectric layer, a conductive via, and a landing pad. The dielectric layer is positioned on the substrate. The conductive via penetrates from a lower surface of the substrate to an upper surface of the dielectric layer. The landing pad is embedded in the conductive via.

In some embodiments, the landing pad has a first top surface substantially coplanar with a second top surface of the conductive via.

In some embodiments, the landing pad has a top surface substantially coplanar with the upper surface of the dielectric layer.

In some embodiments, the conductive via has a top surface substantially coplanar with the upper surface of the dielectric layer.

In some embodiments, the landing pad has a first top width less than a second top width of the conductive via.

In some embodiments, the conductive via and the landing pad have a trapezoidal cross-section.

In some embodiments, a material of the conductive via is different from a material of the landing pad.

The present disclosure provides a method of manufacturing a semiconductor structure. The method includes the following steps. A dielectric layer and a substrate is received, wherein the dielectric layer is disposed on the substrate. An etch stop structure is formed on the dielectric layer, wherein the etch stop structure has an etch stop layer and a protruding portion extending from the etch stop layer into the dielectric layer. A first hole is formed from the substrate to expose a sidewall of the protruding portion. A conductive via is formed in the first hole. The etch stop structure is removed to form a second hole in the conductive via. A landing pad is formed in the second hole.

In some embodiments, the method further includes forming the first hole to expose the etch stop layer.

In some embodiments, forming the landing pad in the second hole includes forming a conductive layer to cover the dielectric layer and the conductive via; and removing a portion of the conductive layer to expose the dielectric layer.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

The present disclosure provides a method of manufacturing a semiconductor structure. FIGS. 1-6 are cross-sectional views schematically illustrating intermediate stages in the manufacturing of a semiconductor structure, in accordance with some embodiments of the present disclosure. Although below using a series of actions or steps described in this method disclosed, but the order of these actions or steps shown should not be construed to limit the present invention. For example, certain actions or steps may be performed in different orders and/or concurrently with other steps. Moreover, not all steps must be performed in order to achieve the depicted embodiment of the present invention. Furthermore, each operation or procedure described herein may contain several sub-steps or actions.

Figure 1:
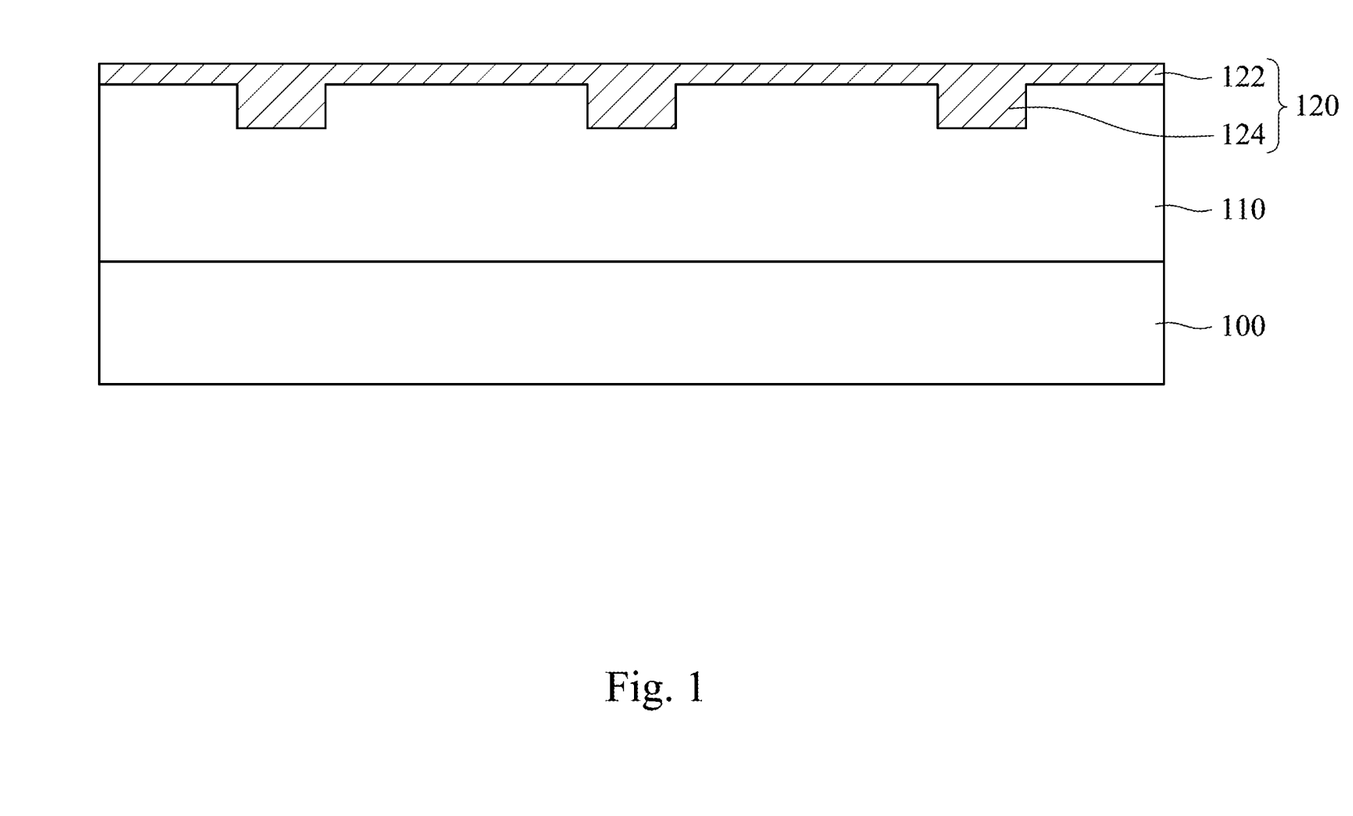
FIGS. 1-6 are cross-sectional views schematically illustrating intermediate stages in the manufacturing of a semiconductor structure, in accordance with some embodiments of the present disclosure.

Please refer to FIG. 1. A substrate 100 and a dielectric layer 110 are received, wherein the dielectric layer 110 is disposed on the substrate 100. Moreover, an etch stop structure 120 is formed on the dielectric layer 110, wherein the etch stop structure 120 has an etch stop layer 122 and a protruding portion 124 extending from the etch stop layer 122 into the dielectric layer 110. In some embodiments, a material of the etch stop structure 120 includes a nitride, an oxide, or a combination thereof. For example, the nitride is silicon nitride (SiN). In some embodiments, the dielectric layer 110 includes silicon dioxide (SiO$_2$).

Figure 2:
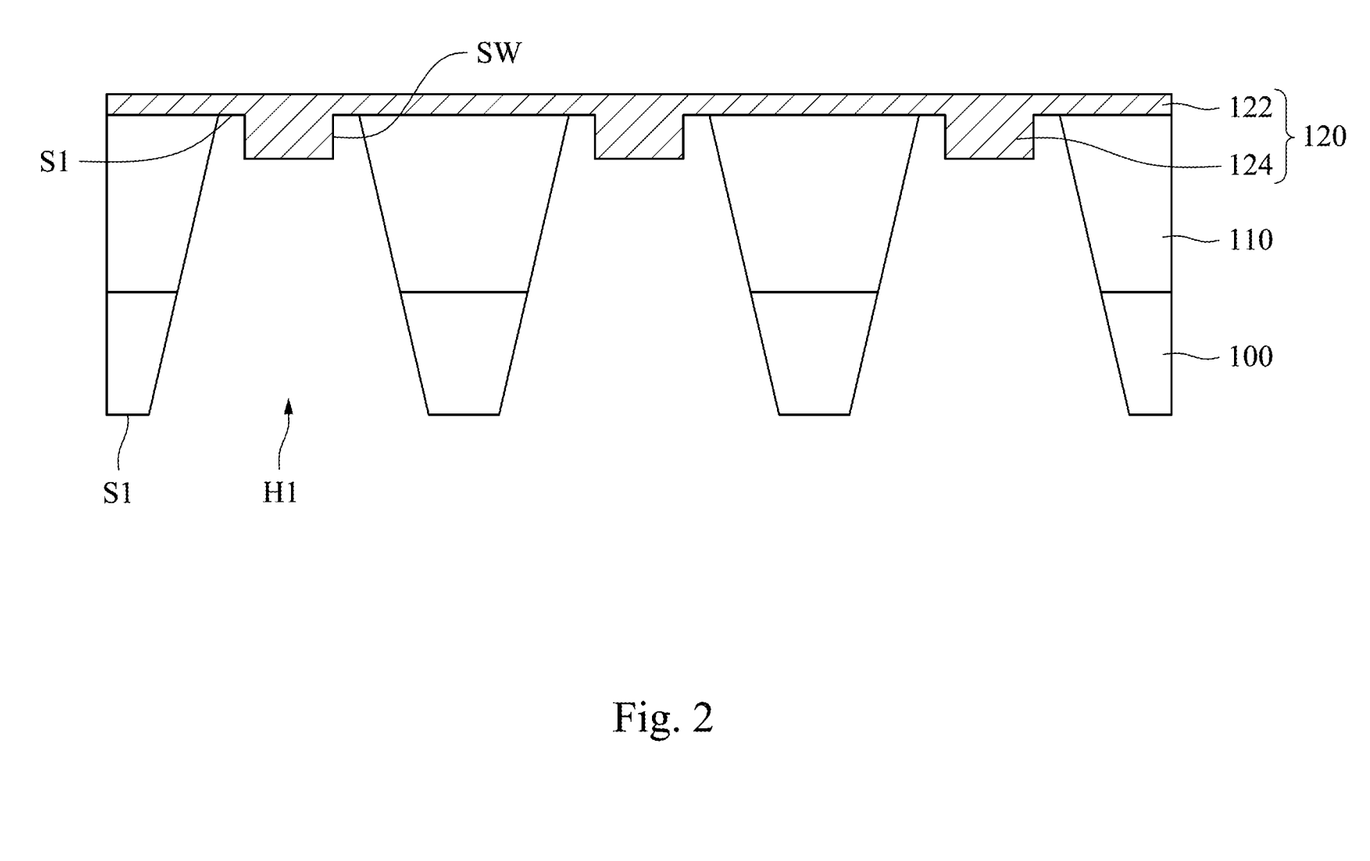

As shown in FIG. 2, a first hole H1 is formed from the substrate 100 to expose a sidewall SW of the protruding portion 124 and a lower surface S1 of the etch stop layer 122. In some embodiments, only the sidewall SW of the protruding portion 124 is exposed from the first hole H1, and the lower surface S1 of the etch stop layer 122 is not exposed. In some embodiments, the first hole H1 is formed by etching.

Figure 3:
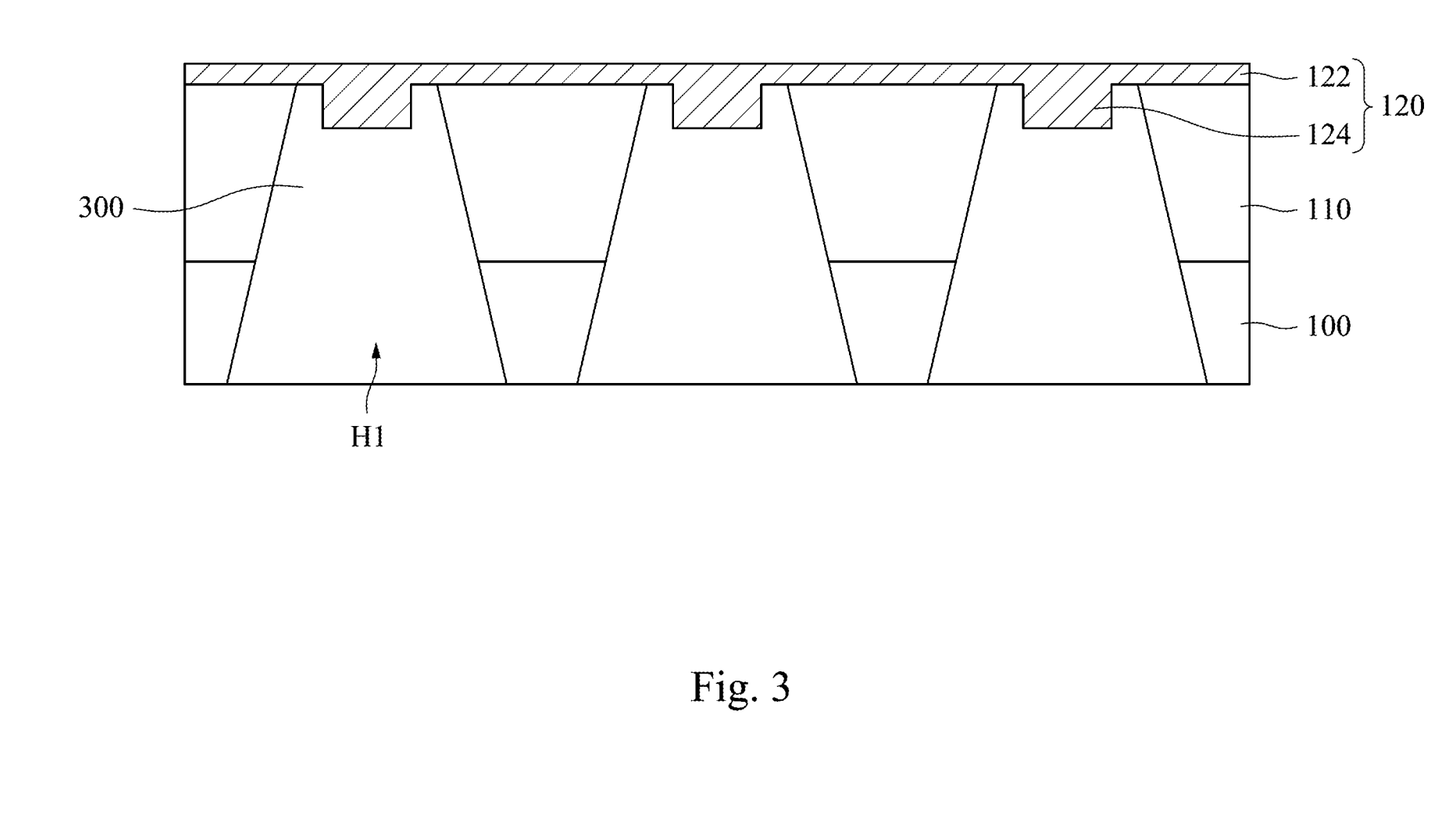

As shown in FIG. 3, a conductive via 300 is formed in the first hole H1. Therefore, the protruding portion 124 of the etch stop structure 120 is embedded in the conductive via 300. In some embodiments, the conductive via 300 includes copper, gold, tungsten, or alloys thereof.

Figure 4:
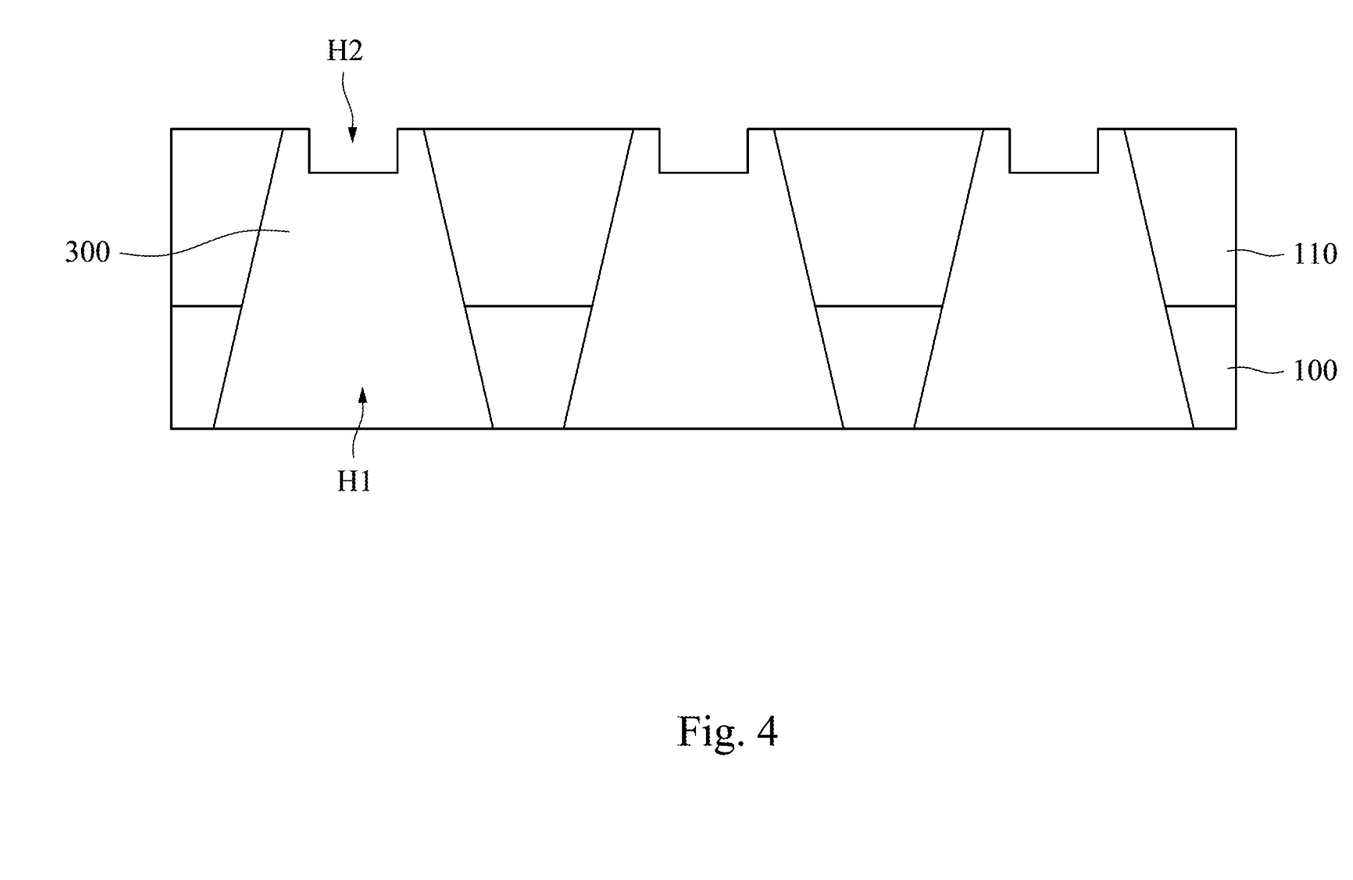

As shown in FIG. 4, the etch stop structure 120 is removed to form a second hole H2 in the conductive via 300. More specifically, because the protruding portion 124 of the etch stop structure 120 is previously embedded in the conductive via 300, after removing the etch stop structure 120, the second hole H2 is formed in the conductive via 300.

Figure 5:
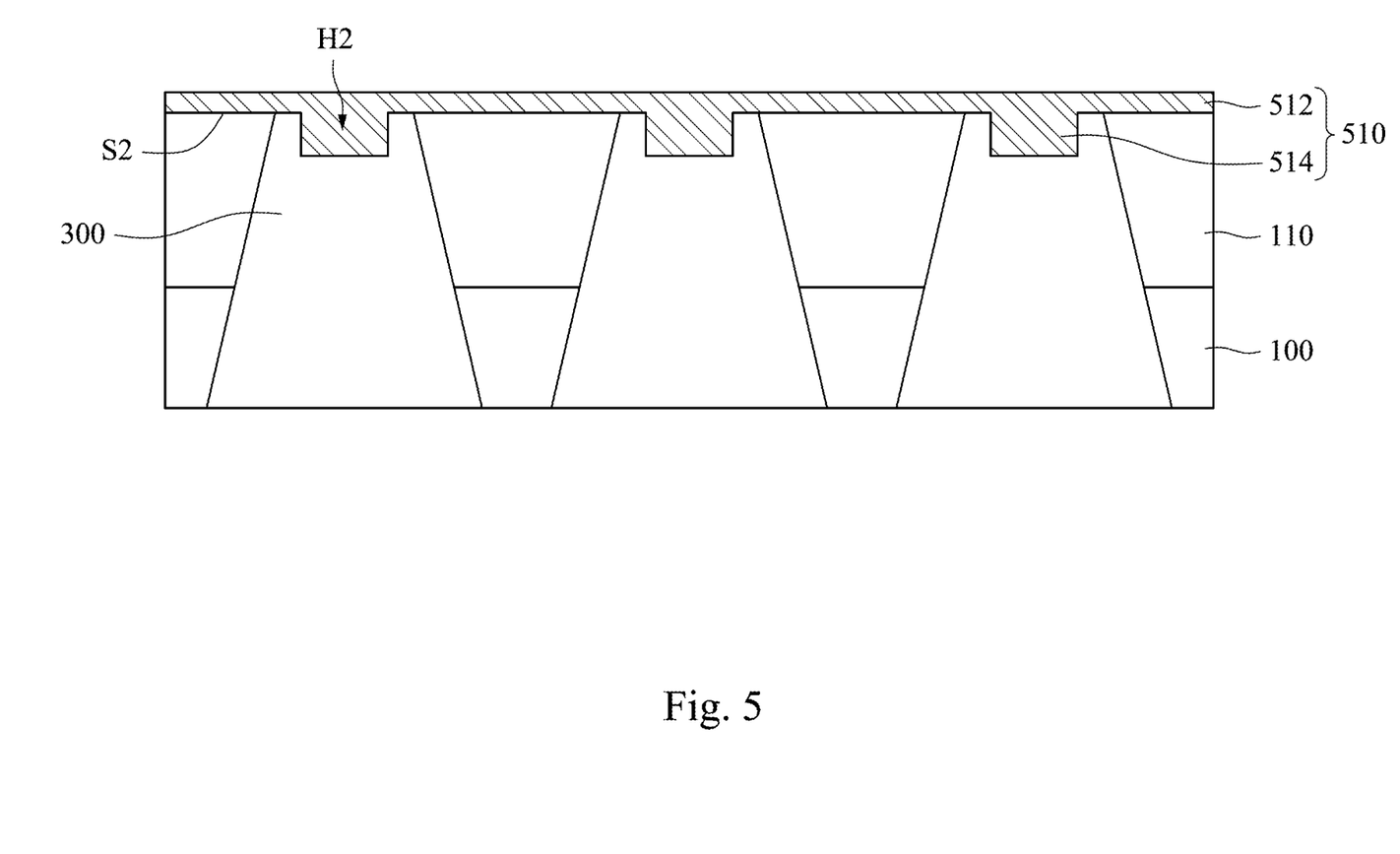

As shown in FIG. 5, a conductive layer 510 is formed to cover the dielectric layer 110 and the conductive via 300. The conductive layer 510 includes a first portion 512 and a second portion 514. The second portion 514 extends from the first portion 512, and fills the second hole H2 of the conductive via 300. An upper surface S2 of the dielectric layer 110 is covered by the first portion 512 of the conductive layer 510. In some embodiments, the conductive layer 510 includes copper, gold, tungsten, or alloys thereof. In some embodiments, a material of the conductive via 300 is different from a material of the conductive layer 510.

Figure 6:
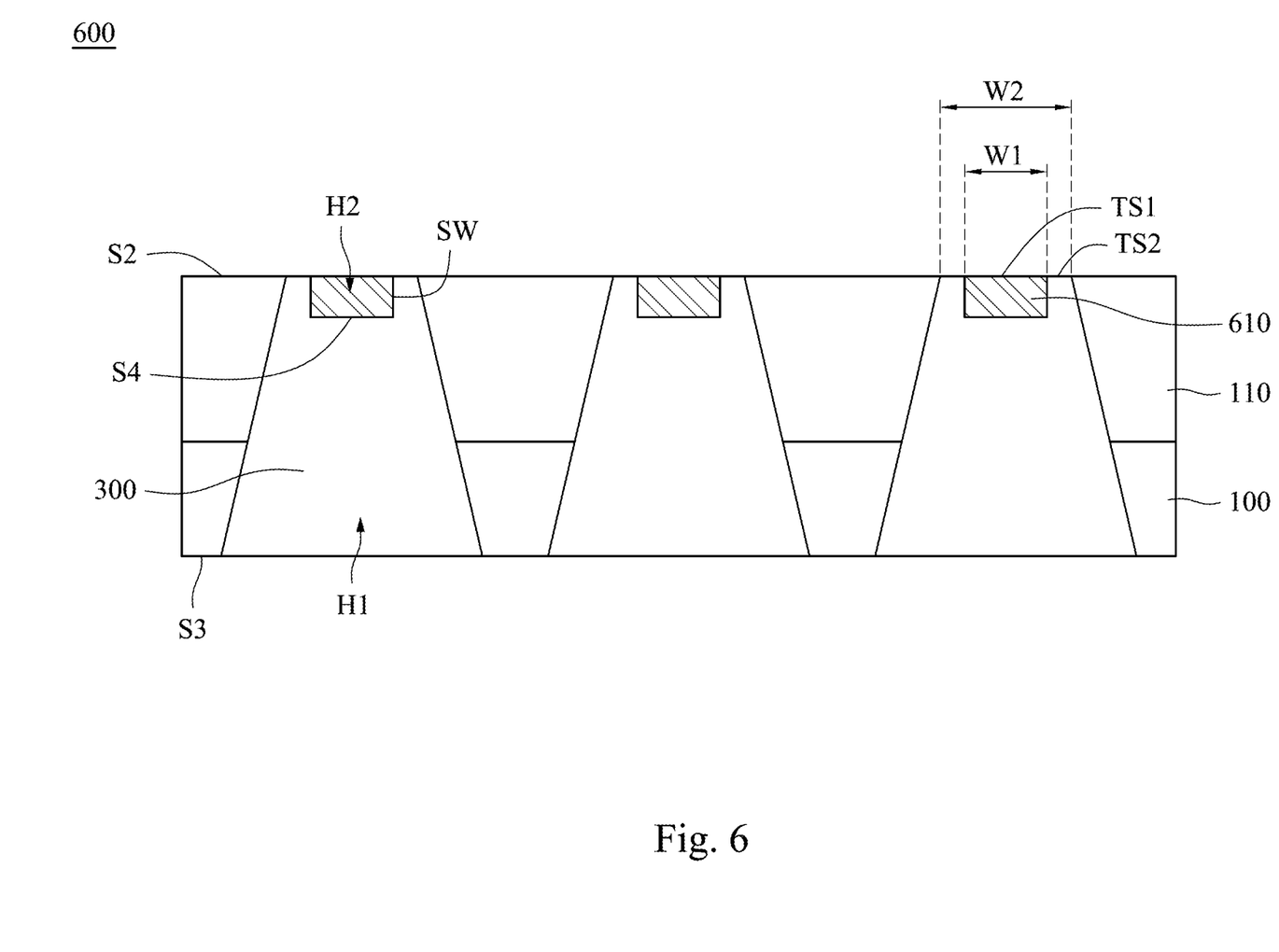

As shown in FIG. 6, a portion of the conductive layer 510 is removed to expose the dielectric layer 110. Therefore, a landing pad 610 is formed in the second hole H2. In some embodiments, the portion of the conductive layer 510 is removed by a chemical-mechanical polishing (CMP).

Please still refer to FIG. 6. A semiconductor structure 600 includes the substrate 100, the dielectric layer 110, the conductive via 300, and the landing pad 610. The dielectric layer 110 is positioned on the substrate 100. The conductive via 300 penetrates from a lower surface S3 of the substrate 100 to the upper surface S2 of the dielectric layer 110. The landing pad 610 is embedded in the conductive via 300. It is noted that the contact surface between the landing pad 610 and the conductive via 300 includes a lower surface S4 and the surface of the sidewall SW of the landing pad 610. Compared with a traditional structure which has a landing pad in contact with a conductive via only by its lower surface, the semiconductor structure 600 of the present disclosure can provide enough contact area between the landing pad 610 and the conductive via 300.

In some embodiments, the landing pad 610 has a top surface TS1 substantially coplanar with a top surface TS2 of the conductive via 300 as shown in FIG. 6. In some embodiments, the landing pad 610 has the top surface TS1 substantially coplanar with the upper surface S2 of the dielectric layer 110 as shown in FIG. 6. In some embodiments, the conductive via 300 has the top surface TS2 substantially coplanar with the upper surface S2 of the dielectric layer 110 as shown in FIG. 6.

In some embodiments, the landing pad 610 has a top width W1 less than a top width W2 of the conductive via 300 as shown in FIG. 6. Different from a traditional structure which has a landing pad with a lower surface greater than an upper surface of a conductive via, the landing pad 610 of the present disclosure is smaller than the landing pad of the traditional structure. Therefore, it is beneficial for minimizing the semiconductor structure 600 of the present disclosure.

In some embodiments, the conductive via 300 and the landing pad 610 have a trapezoidal cross-section as shown in FIG. 6. In some embodiments, the conductive via 300 includes a dielectric layer and a conductive pillar. The conductive pillar is surrounded by the dielectric layer. The conductive pillar is separated from the substrate 100 and the dielectric layer 110 by the dielectric layer. In some embodiments, a material of the conductive via 300 is different from a material of the landing pad 610.

Figure 7A:
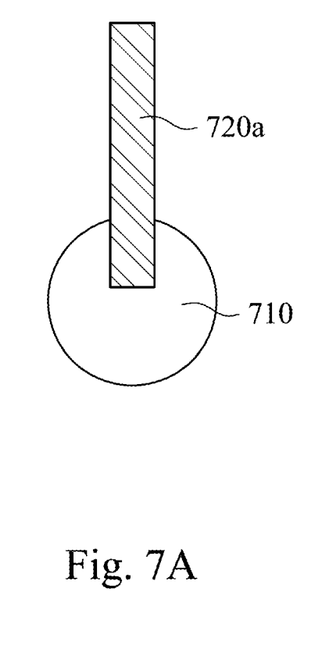
FIGS. 7A-7C are top views schematically illustrating a landing pad and a conductive via, in accordance with some embodiments of the present disclosure.
Figures 7B, 7C:
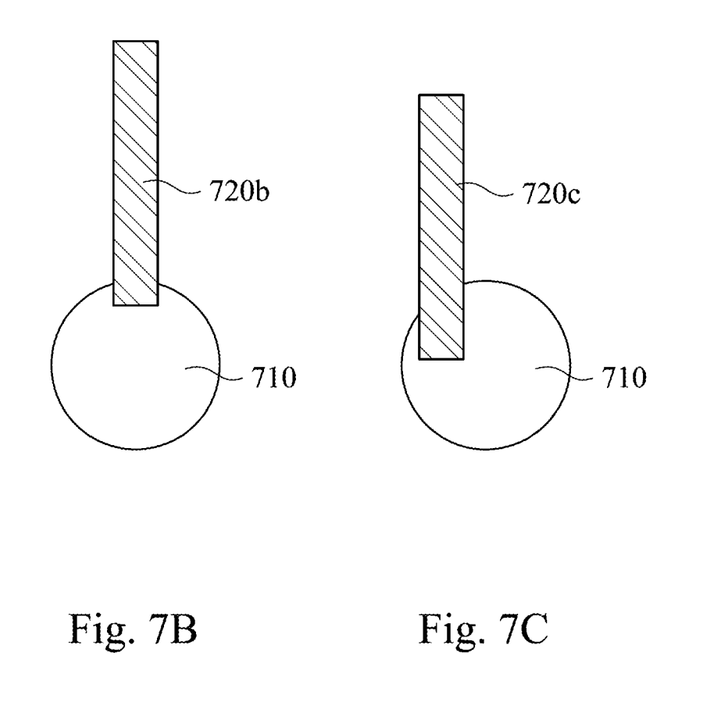

FIGS. 7A-7C are top views schematically illustrating a landing pad and a conductive via, in accordance with some embodiments of the present disclosure. As shown in FIG. 7A, a landing pad 720a accurately aligns with a conductive via 710. The contact surface between the landing pad 720a and the conductive via 710 includes the lower surface and the sidewall surface of the landing pad 720a which are in contact with the conductive via 710. As shown in FIG. 7B, a landing pad 720b does not accurately align with the conductive via 710. The contact surface between the landing pad 720b and the conductive via 710 includes the lower surface and the sidewall surface of the landing pad 720b which are in contact with the conductive via 710, and therefore the contact surface is large enough for electrical connection between the landing pad 720b and the conductive via 710. The contact surface between the landing pad 720c and the conductive via 710 includes the lower surface and the sidewall surface of the landing pad 720c which are in contact with the conductive via 710, and therefore the contact surface is large enough for electrical connection between the landing pad 720c and the conductive via 710.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor structure, comprising:
   a substrate;
   a dielectric layer positioned on the substrate;
   a conductive via penetrating from a lower surface of the substrate to an upper surface of the dielectric layer; and
   a landing pad embedded in the conductive via.

2. The semiconductor structure of claim 1, wherein the landing pad has a first top surface substantially coplanar with a second top surface of the conductive via.

3. The semiconductor structure of claim 1, wherein the landing pad has a top surface substantially coplanar with the upper surface of the dielectric layer.

4. The semiconductor structure of claim 1, wherein the conductive via has a top surface substantially coplanar with the upper surface of the dielectric layer.

5. The semiconductor structure of claim 1, wherein the landing pad has a first top width less than a second top width of the conductive via.

6. The semiconductor structure of claim 1, wherein the conductive via and the landing pad taken together have a trapezoidal cross-section.

7. The semiconductor structure of claim 1, wherein a material of the conductive via is different from a material of the landing pad.

8. A method of manufacturing a semiconductor structure, the method comprising:
- receiving a dielectric layer and a substrate, wherein the dielectric layer is disposed on the substrate;
- forming an etch stop structure on the dielectric layer, wherein the etch stop structure has an etch stop layer and a protruding portion extending from the etch stop layer into the dielectric layer;
- forming a first hole from the substrate to expose a sidewall of the protruding portion;
- forming a conductive via in the first hole;
- removing the etch stop structure to form a second hole in the conductive via; and
- forming a landing pad in the second hole.

9. The method of claim 8, further comprising forming the first hole to expose the etch stop layer.

10. The method of claim 8, wherein forming the landing pad in the second hole comprises:
- forming a conductive layer to cover the dielectric layer and the conductive via; and
- removing a portion of the conductive layer to expose the dielectric layer.

* * * * *